United States Patent
Ronaghi et al.

(10) Patent No.: US 7,782,237 B2
(45) Date of Patent: Aug. 24, 2010

(54) SEMICONDUCTOR SENSOR CIRCUIT ARRANGEMENT

(75) Inventors: Mostafa Ronaghi, Los Altos Hills, CA (US); Ali Agah, Campbell, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/139,299

(22) Filed: Jun. 13, 2008

(65) Prior Publication Data

US 2009/0309773 A1 Dec. 17, 2009

(51) Int. Cl.
*H03M 1/66* (2006.01)
(52) U.S. Cl. .................. 341/143; 341/118; 341/155; 341/120
(58) Field of Classification Search .......... 341/117–120, 341/143, 155
See application file for complete search history.

(56) References Cited

U.S. PATENT DOCUMENTS

| | | | |
|---|---|---|---|
| 4,796,004 A | 1/1989 | Rich et al. | |
| 4,857,928 A | 8/1989 | Gailus et al. | |
| 5,001,725 A | 3/1991 | Senderowicz et al. | |
| 5,065,157 A | 11/1991 | Ribner et al. | |
| 5,072,219 A | 12/1991 | Boutaud et al. | |
| 5,140,325 A | 8/1992 | Yu et al. | |
| 5,142,286 A | 8/1992 | Ribner et al. | |
| 5,148,166 A | 9/1992 | Ribner | |
| 5,150,120 A | 9/1992 | Yunus | |
| 5,181,032 A | 1/1993 | Ribner | |
| 5,187,482 A | 2/1993 | Tiemann et al. | |
| 5,231,395 A | 7/1993 | Irwin et al. | |
| 5,266,952 A | 11/1993 | Stone et al. | |
| 5,287,107 A | 2/1994 | Gampell et al. | |
| 5,305,004 A | 4/1994 | Fattaruso | |
| 5,323,157 A | 6/1994 | Ledzius et al. | |
| 5,323,158 A | 6/1994 | Ferguson, Jr. | |
| 5,329,282 A | 7/1994 | Jackson | |
| 5,392,042 A * | 2/1995 | Pellon ..................... 341/143 |
| 5,408,233 A | 4/1995 | Gannon et al. | |
| 5,408,235 A | 4/1995 | Doyle et al. | |
| 5,442,353 A | 8/1995 | Jackson | |
| 5,461,425 A | 10/1995 | Fowler et al. | |
| 5,495,200 A | 2/1996 | Kwan et al. | |
| 5,563,535 A | 10/1996 | Corry et al. | |
| 5,583,501 A | 12/1996 | Henrion et al. | |
| 5,585,801 A | 12/1996 | Thurston | |
| 5,594,612 A | 1/1997 | Henrion | |

(Continued)

OTHER PUBLICATIONS

J. De Maeyer, P. Rombouts, and L. Weyten, "*A Double-Sampling Extended-Counting ADC*," IEEE Journal of Solid-State Circuits, vol. 39, No. 3, pp. 411-418, Mar. 2004.

(Continued)

*Primary Examiner*—Jean B Jeanglaude
(74) *Attorney, Agent, or Firm*—Crawford Maunu PLLC

(57) ABSTRACT

An error-corrected representation of an input signal, such as a bioluminescence signal, is generated. An analog representation of the input signal is oversampled and quantized to provide a first-stage digital output and a residual error. The residual error is provided as a second-stage digital output using successive approximation. The first-stage and second-stage digital outputs are used to generate an error-corrected representation of the bioluminescence signal.

20 Claims, 3 Drawing Sheets

U.S. PATENT DOCUMENTS

| | | | |
|---|---|---|---|
| 5,736,848 A | 4/1998 | De Vries et al. | |
| 5,757,299 A | 5/1998 | Noro et al. | |
| 5,757,300 A | 5/1998 | Koilpillai et al. | |
| 5,801,657 A | 9/1998 | Fowler et al. | |
| 5,815,102 A | 9/1998 | Melanson | |
| 5,818,375 A | 10/1998 | Yoshizawa | |
| 5,825,756 A | 10/1998 | Hattori | |
| 5,841,386 A | 11/1998 | Leduc | |
| 5,859,605 A | 1/1999 | Raghavan et al. | |
| 5,982,315 A | 11/1999 | Bazarjani et al. | |
| 5,999,114 A | 12/1999 | Hendricks | |
| 6,016,114 A | 1/2000 | Liu et al. | |
| 6,018,262 A | 1/2000 | Noro et al. | |
| 6,061,009 A | 5/2000 | Krone et al. | |
| 6,067,036 A | 5/2000 | Mauthe et al. | |
| 6,085,576 A | 7/2000 | Sunshine et al. | |
| 6,087,968 A | 7/2000 | Roza | |
| 6,150,969 A | 11/2000 | Melanson | |
| 6,205,219 B1 | 3/2001 | Hollenbach et al. | |
| 6,218,973 B1 | 4/2001 | Barrett, Jr. et al. | |
| 6,266,002 B1 | 7/2001 | Gong et al. | |
| 6,275,021 B1 | 8/2001 | Windsheimer | |
| 6,310,571 B1 | 10/2001 | Yang et al. | |
| 6,313,775 B1 | 11/2001 | Lindfors et al. | |
| 6,320,526 B1 | 11/2001 | Gandolfi et al. | |
| 6,339,647 B1 | 1/2002 | Andersen et al. | |
| 6,373,334 B1 | 4/2002 | Melanson | |
| 6,396,429 B2 * | 5/2002 | Singer et al. | 341/155 |
| 6,407,689 B1 | 6/2002 | Bazarjani et al. | |
| 6,414,614 B1 | 7/2002 | Melanson | |
| 6,417,792 B1 | 7/2002 | King et al. | |
| 6,480,129 B1 | 11/2002 | Melanson | |
| 6,483,388 B2 | 11/2002 | Khan | |
| 6,496,128 B2 | 12/2002 | Wiesbauer et al. | |
| 6,538,588 B1 | 3/2003 | Bazarjani | |
| 6,538,592 B1 | 3/2003 | Yang et al. | |
| 6,570,176 B1 * | 5/2003 | Fucile | 250/573 |
| 6,606,359 B1 | 8/2003 | Nag et al. | |
| 6,608,572 B1 | 8/2003 | Venkitachalam et al. | |
| 6,608,575 B2 | 8/2003 | Bazarjani | |
| 6,611,570 B1 | 8/2003 | Subramanian | |
| 6,642,873 B1 | 11/2003 | Kuang | |
| 6,693,573 B1 | 2/2004 | Linder | |
| 6,697,438 B2 | 2/2004 | Doetsch et al. | |
| 6,803,870 B2 * | 10/2004 | Kuttner | 341/155 |
| 6,836,228 B1 | 12/2004 | Levinson et al. | |
| 6,842,128 B2 | 1/2005 | Koh | |
| 6,853,321 B2 | 2/2005 | Ohashi et al. | |
| 6,894,612 B2 * | 5/2005 | Xydis | 340/539.11 |
| 6,922,161 B2 | 7/2005 | Lee | |
| 6,930,624 B2 | 8/2005 | Hezar et al. | |
| 6,940,435 B2 | 9/2005 | Laamanen | |
| 6,940,436 B2 | 9/2005 | Hezar et al. | |
| 6,940,445 B2 | 9/2005 | Kearney | |
| 6,943,715 B2 | 9/2005 | Radja et al. | |
| 6,970,118 B2 | 11/2005 | Regier | |
| 7,015,843 B2 | 3/2006 | Jelonnek | |
| 7,015,844 B1 * | 3/2006 | Boemler | 341/143 |
| 7,030,797 B2 | 4/2006 | Jelonnek | |
| 7,031,395 B2 | 4/2006 | Hinrichs et al. | |
| 7,075,383 B2 | 7/2006 | Adachi et al. | |
| 7,127,221 B2 | 10/2006 | Hammes et al. | |
| 7,193,548 B2 | 3/2007 | Kaplan | |
| 7,212,847 B2 | 5/2007 | Petersen et al. | |
| 7,224,238 B2 | 5/2007 | Adachi et al. | |
| 7,227,491 B2 | 6/2007 | Doerrer et al. | |
| 7,242,334 B2 | 7/2007 | Holden | |
| 7,304,592 B2 | 12/2007 | Pinna et al. | |
| 7,308,032 B2 | 12/2007 | Capofreddi | |
| 7,365,669 B1 | 4/2008 | Melanson | |
| 7,423,573 B2 | 9/2008 | Baginski et al. | |
| 7,479,911 B2 | 1/2009 | Chakrabartty | |
| 7,515,080 B2 | 4/2009 | Akizuki et al. | |
| 7,532,138 B2 | 5/2009 | Akizuki et al. | |
| 2005/0275571 A1 * | 12/2005 | Bjornsen | 341/119 |

OTHER PUBLICATIONS

J. Markus, J. Silva, and G. Temes, "*Theory and Applications of Incremental ΔΣ Converters,*" IEEE Transactions on Circuits and Systems—I: Regular Papers, vol. 51, No. 4, pp. 678-690, Apr. 2004.

K. Nam, S. Lee, D. Su, and B. Wooley, "*A Low-Voltage Low-Power Sigma-Delta Modulator for Broadband Analog-To-Digital Coversion,*" IEEE Journal of Solid-State Circuits, vol. 40, No. 9, pp. 1855-1864, Sep. 2005.

A. Hassibi, A. Agah, J.D. Plummer, and P.B. Griffin, "*Design Requirements for Integrated Biosensor Arrays,*" Proc. SPIE, vol. 5699, pp. 403-413, Mar. 2005.

A. Agah, K. Vleugels, P.B. Griffin, M. Ronaghi, J.D. Plummer, and B.A. Wooley, "*A High-Resolution Low-Power Oversampling ADC with Extended-Range for Bio-Sensor Arrays,*" 2007 Symposia on VLSI Technology and Circuits, (Jun. 2007) Kyoto, Japan.

H. Eltoukhy, K. Salama, A. El Gamal, M. Ronaghi, R. Davis, "*A 0.18um CMOS $10^{-6}$lux Bioluminescence Detection System-on-Chip,*"IEEE International Solid-State Circuits Conference, Digest Of Technical Papers, Session 12, pp. 1-3, Feb. 2004.

\* cited by examiner

SEMICONDUCTOR SENSOR CIRCUIT ARRANGEMENT

FEDERALLY-SPONSORED RESEARCH OR DEVELOPMENT

This invention was made with Government support under contract HG000357 awarded by the National Institutes of Health. The Government has certain rights in this invention.

FIELD OF THE INVENTION

The present invention relates generally to sensors, systems and approaches therefor.

BACKGROUND

Semiconductor-based sensors have been used in many applications involving the detection of a wide variety of characteristics in a multitude of disciplines. For example, image sensor arrays are finding widespread use in biological assay applications such as gene expression analysis and DNA sequencing. In related applications, both CCD and CMOS mega-pixel array platforms have been used to simultaneously capture bioluminescence or fluorescence signals from millions of miniaturized reaction chambers.

Bioluminescence signals generally have very low bandwidths, and can be extremely small compared to background noise due to the miniaturization of reaction volumes. To achieve sufficiently high sensitivity in a bio-sensor array, sensor signals are digitized with a high absolute accuracy (low noise and high linearity). The conversion rate required is governed by the number of sensor elements.

One particular sensing application involves Pyrosequencing, which takes advantage of bioluminescence detection for determining the nucleotide incorporation into the DNA molecule. There are various devices suitable for bioluminescence detection. A sensitive detection device is the photomultiplier tube (PMT); however, the overall photon detection efficiency of PMT-based systems is limited to 1-4% by the optics and low quantum efficiency (10%) of PMTs. Also, PMTs are bulky, costly, and require high operating voltages (1000 VDC), which has presented challenges to their use in a low-power, massively parallel system.

Another type of photosensor is the CCD (charge-coupled device). CCDs employ a "bucket brigade" to serially shift out the photogenerated electrons accumulated at each photosite. This charge transfer mechanism is noise-less, which leads to very good signal-to-noise ratio (SNR). However, CCD devices are fabricated in a nonstandard semiconductor process and are not readily integrated with other analog or digital circuits. As a result, its image sensors achieve very high sensitivity, low noise, and high uniformity at the price of inflexibility, added complexity, and higher cost.

These and other issues have been challenging to sensor applications, and particularly challenging to the sensing of bioluminescence in DNA sequencing applications.

SUMMARY

The present invention is directed to sensor arrangements that address challenges including those discussed above, and that are applicable to a variety of sensors and sensing applications including those involving optical, chemical, biological, gas, and other types of sensors and sensing. These and other aspects of the present invention are exemplified in a number of implementations and applications, some of which are shown in the figures and characterized in the claims section that follows.

According to an example embodiment, an error-corrected representation of a sensor signal is generated. An analog representation of the signal is oversampled and quantized to provide a first-stage digital output and a residual error. The residual error is provided as a second-stage digital output using successive approximation. An error-corrected representation of the signal is generated, based upon the first-stage and second-stage digital outputs.

According to another example embodiment, a circuit arrangement generates an error-corrected representation of a bioluminescence signal. The arrangement includes a first-stage analog-to-digital converter (ADC) circuit that oversamples and quantizes an analog representation of the bioluminescence signal to provide a first-stage digital output and a residual error. A second-stage ADC circuit uses successive approximation to provide the residual error in a second-stage digital output. An output circuit generates an error-corrected representation of the bioluminescence signal based upon the first-stage and second-stage digital outputs.

The above summary is not intended to describe each illustrated embodiment or every implementation of the present invention.

BRIEF DESCRIPTION OF THE DRAWINGS

The invention may be more completely understood in consideration of the detailed description of various embodiments of the invention that follows in connection with the accompanying drawings in which.

Figure 1:
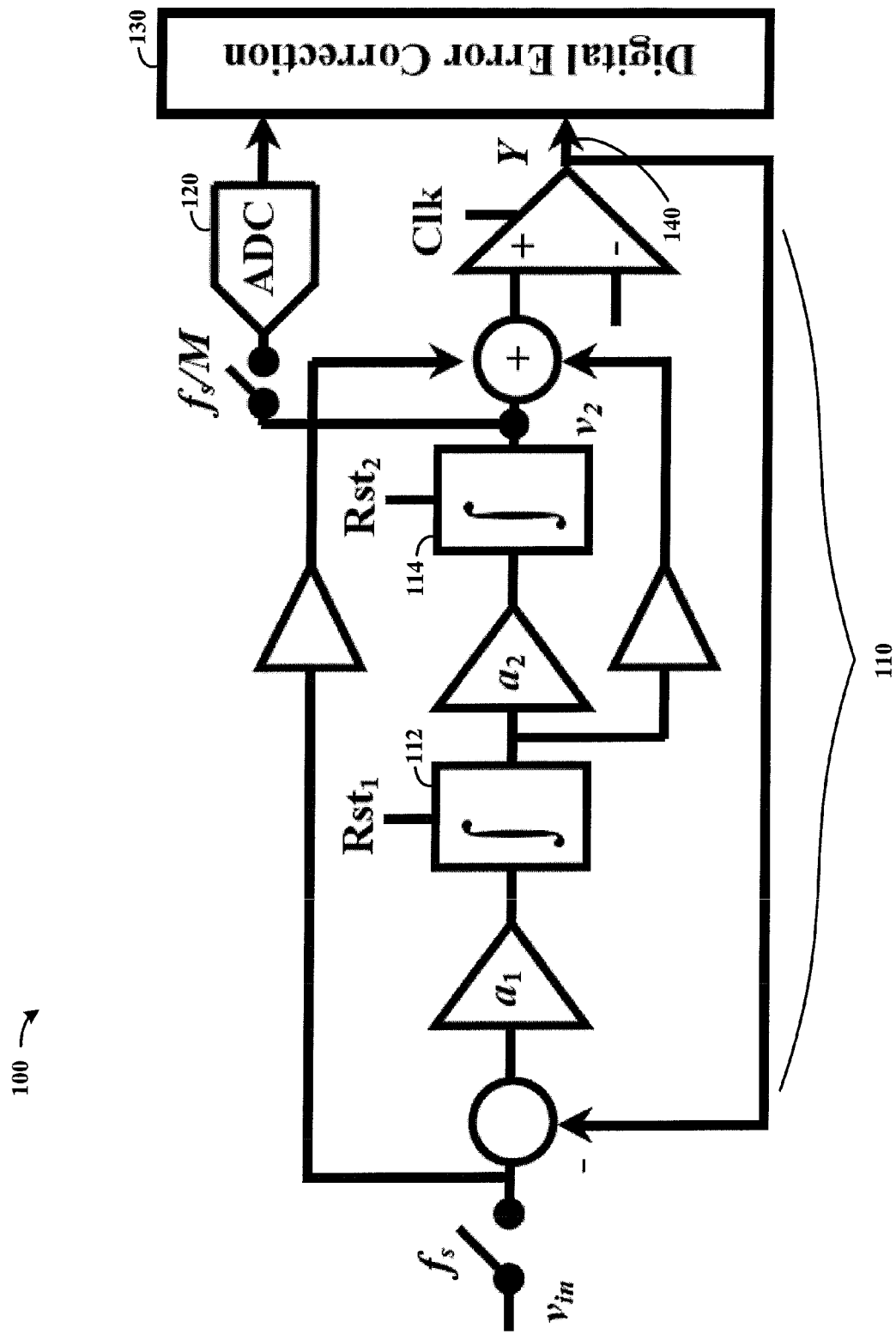
FIG. 1 shows an ADC arrangement with $\Sigma\Delta$ modulation, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is directed to semiconductor sensors and related approaches, their uses and systems for the same. These and other aspects of the present invention are exemplified in a number of illustrated implementations and applications, some of which are shown and characterized in the following description and related figures, and further in the claims section that follows.

According to an example embodiment of the present invention, an analog-to-digital converter (ADC) arrangement employs an extended-counting architecture in which the residual error from a second-order incremental $\Sigma\Delta$ modulator is encoded using a successive approximation (SA) analog-to-digital conversion. In some implementations, the ADC arrangement is implemented with a calibration-free, high-resolution ADC for bioluminescence sensing.

The ADC arrangement is readily implementable with a variety of circuits and circuit arrangements. In one embodiment, the ADC is integrated with 0.18-μm CMOS technology to facilitate a dynamic range of about 90.1 dB and a peak signal-to-noise plus distortion ratio (SNDR) of about 86.3 dB at a conversion rate of about 1 MSample/sec with 38 mW power consumption. The CMOS-based ADC arrangement sensors uses a capacitive element or a trans-impedance amplifier to store photo-generated current as a voltage, and uses buffers to transfer the signal to column-level or chip-level amplifiers and/or analog-to-digital converters. Noise is reduced via two-stage architecture with an incremental ΣΔ modulator and related circuitry.

In some embodiments, an ADC arrangement includes an incremental ΣΔ modulator with resolution enhanced using a two-step A/D conversion process involving an input stage and a second stage ADC. First, the input stage ΣΔ modulator oversamples and quantizes an input signal. A residual error from this operation is then passed on to a second ADC. The digital codes from the two conversion steps are combined to achieve high resolution and desirable integral non-linearity (INL) at relatively low oversampling ratios. In many applications, this approach is achieved via calibration-free operation.

The ADC arrangement can be implemented with a variety of sensing applications, including those relevant to Pyrosequencing and/or optical sensing. In some embodiments, the arrangement is used to facilitate real-time detection via millions of individual sensors in a mega-pixel array sensor with relatively high dynamic range (e.g., 20 bit).

For general information regarding approaches to ΣΔ modulation, and for specific information regarding ΣΔ modulation approaches that may be implemented in connection with one or more example embodiments, reference may be made to A. Agah, K. Vleugels, P. B. Griffin, M. Ronaghi, J. D. Plummer, and B. A. Wooley, *A High-Resolution Low-Power Oversampling ADC with Extended-Range for Bio-Sensor Arrays*, 2007 Symposia on VLSI Technology and Circuits, (June, 2007) Kyoto, Japan, and to the references cited therein, all of which are fully incorporated herein by reference.

In connection with certain embodiments, incremental ΣΔ modulators refer to a class of oversampling ADCs that combine aspects ΣΔ modulators with multiplexing capabilities. In these incremental ΣΔ modulators, the input signal is oversampled by a ΣΔ modulator for only a certain number of times (defining an oversampling ratio, M) to form an estimate of the input signal. Then, all of the modulator integrators reset before processing the next independent input. Incremental converters are in essence ΣΔ modulators constantly operating in the transient mode.

Turning now to the figures, FIG. 1 shows an ADC arrangement 100 with second-order incremental ΣΔ modulation operating at a sampling frequency $f_s$, according to another example embodiment of the present invention. The ADC arrangement 100 includes a first-stage incremental ΣΔ modulator 110 and a second-stage ADC 120. The modulator 110 includes first and second integrators 112 and 114 connected as shown, and uses a feed-forward topology to lower the signal swings at the integrator outputs. The second-stage ADC 120 employs a successive approximation (SA) architecture that encodes the residual error at the first stage output. This second stage is operated at the conversion rate of $f_s/M$ to convert the residue once at the end of the first-stage operation. This translates to power savings in the second stage (e.g., relative to performing additional conversions).

Assuming a DC input $v_{in}$ to the modulator, the output of the second integrator 114 after M cycles, $v_2(M)$ can be written in terms of $v_{in}$, and the modulator output bit sequence Y(j) as:

$$v_2(M) = a_1 a_2 \frac{M(M-1)}{2} v_{in} + a_1 a_2 V_{ref} \sum_{j=1}^{M-1} (M-j)Y(j) \quad \text{(Equation 1)}$$

The input $v_{in}$ can therefore be estimated at 130 if $v_2(M)$ is read by the second-stage ADC 120 and combined with the triangularly-weighted output sequence (at 140) of the ΣΔ modulator 110. The quantization error in the overall output is characterized by the quantization error in the successive approximation stage:

$$E_{Q-ADC} = \frac{2}{a_1 a_2 M(M-1)} E_{Q-SA} \quad \text{(Equation 2)}$$

In some applications, the coefficients in the second-order ΣΔ modulator are chosen to result in high resolution while avoiding clipping for high-amplitude inputs.

The resolution characterized by Equation 2 can be lowered in practice by non-idealities in the ΣΔ modulator 110, such as finite integrator opamp gain, settling, slew and capacitor mismatch. In some embodiments, the influence of these non-idealities is studied via system-level simulations (e.g., using a software approach such as MATLAB) and the circuit is operated and/or modified in response thereto (e.g., via coefficients). For certain applications involving a second-order extended-range modulator, thermal noise is approximately 4/3(kT/MC), which is a factor of 4/3 more compared to a conventional ΣΔ modulator with the same oversampling ratio.

The arrangement 100 can be implemented in a variety of circuits and/or in logic-based devices that effect functionality as described herein. In some applications, the arrangement 100 is integrated in a 0.18-μm CMOS-based chip. In other applications, the arrangement 100 is integrated in other semiconductor chips and/or in related systems.

Figure 2:
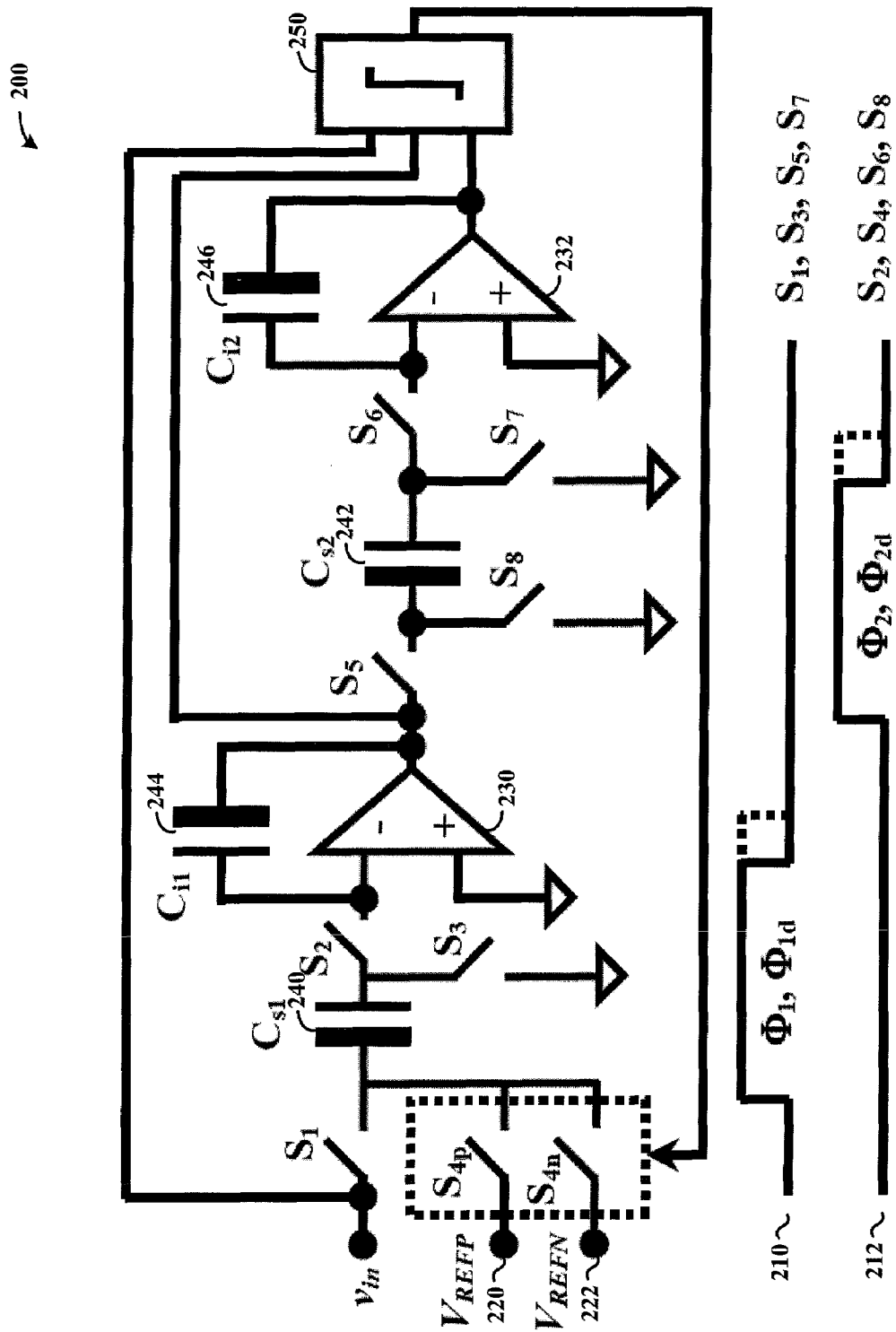
FIG. 2 shows a $\Sigma\Delta$ modulator circuit, according to another example embodiment of the present invention.

FIG. 2 shows a switched-capacitor ΣΔ modulator circuit 200, according to another example embodiment of the present invention. The modulator circuit 200 is readily implemented with a variety of circuits and, with some embodiments, is implemented in connection with a circuit such as the circuit 100 shown in FIG. 1.

Non-overlapping clock cycles are generated from a differential clock input, and shown by way of example at 210 and 212. Input sampling switches 220 and 222 are constant-VGS circuits that provide a bootstrapping function as a switch and suppress sampling nonlinearities. First and second-stage opamps are implemented with folded-cascode amplifiers with gain boosting to achieve 96 dB of DC gain and above 375 MHz UGBW (unity gain bandwidth). A comparator includes a capacitor network (240, 242, 244, 246) to implement feed-forward coefficients, two stages of pre-amplification with output-input series offset cancellation, and a dynamic latch.

As relevant to the above figure discussion and according to an example embodiment, a reset procedure is initiated by a separate clock pulse that triggers sampling of the second integrator output onto the SA-ADC (e.g., 120) input capacitor, and resets the modulator integrators in an appropriate sequence. The SA-ADC then encodes the residue while the first-stage modulator simultaneously processes the next sample. For certain applications, an 11-bit SA-ADC is implemented using a dual-capacitor array to reduce the input capacitance to roughly 3 pF using a unit capacitance of 48 fF.

The SA conversion can be completed in 11 cycles of charge redistribution and comparison in a total time of less than about 500 ns.

In some applications, the circuits shown in FIG. 1, FIG. 2 or otherwise described herein are implemented in a CMOS-based semiconductor device with customized photodetectors to suit detection requirements of a specific biological assay application. The detection area of each photodiode (e.g., providing an input at $v_{in}$) are sized with respect to the assay volume and its light-generation characteristics to perform high optical efficiency contact imaging. In some implementation, the circuits are implemented with "contact" photonic detection of chemiluminescence, without necessarily implementing intermediary optics, thereby increasing the sensitivity of the system by an order of magnitude.

Figure 3:
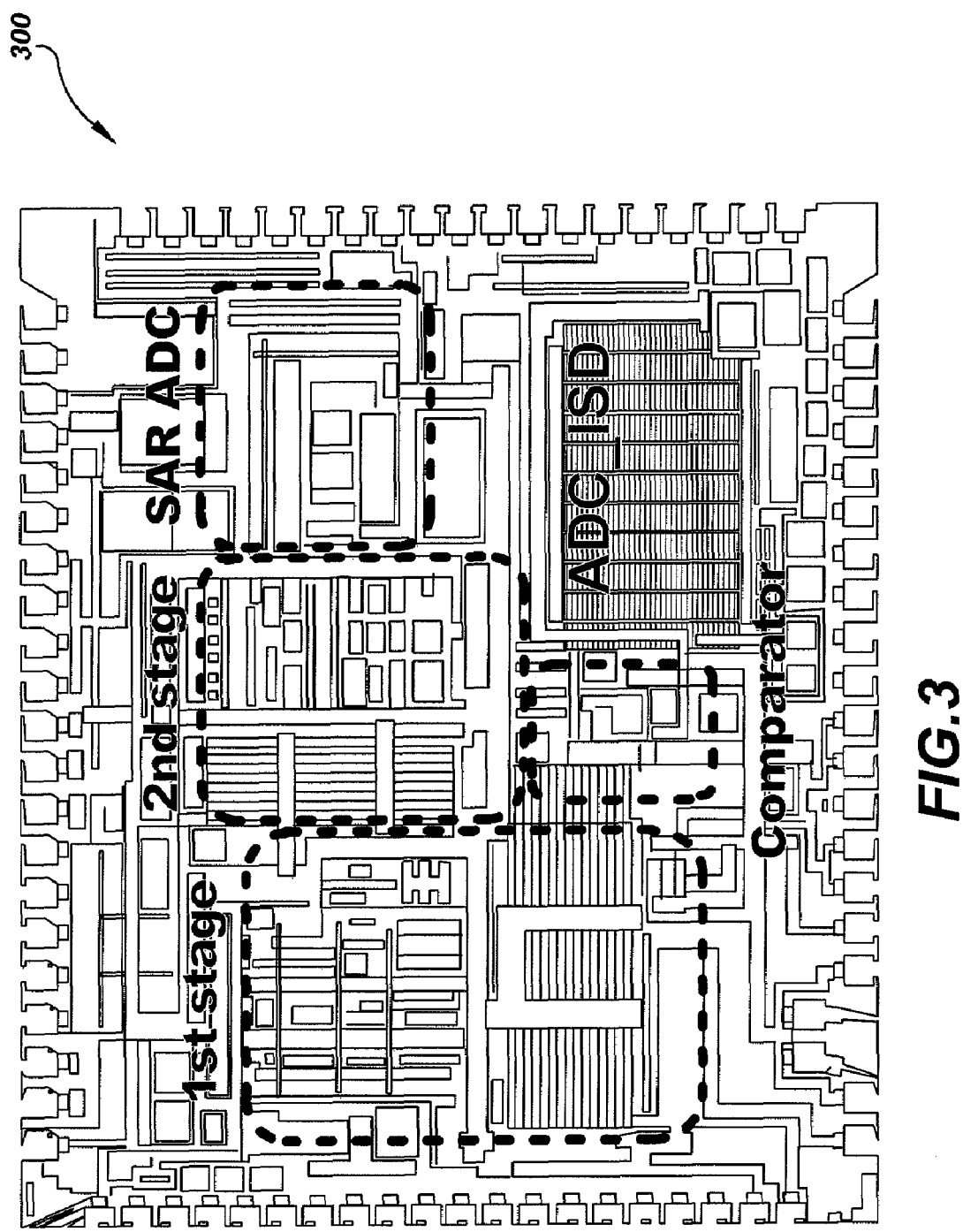
FIG. 3 shows an integration of an ADC circuit with an 0.18-$\mu$m CMOS chip that operates from a 1.8V supply, according to another example embodiment of the present invention.

FIG. 3 shows an integrated ADC circuit 300 (e.g., such as described above) with an 0.18-μm CMOS chip that operates from a 1.8V supply, according to another example embodiment. A ΣΔ modulator (first stage) operates at a clock frequency of about 45.2 MHz with an oversampling ratio of about 45, exhibiting a peak SNDR of about 86.3 dB, and a 97 dB SFDR (spurious-free dynamic range). The ADC circuit 300 achieves about 90.1 dB of dynamic range and dissipates 38 mW (excluding output drivers), out of which 23 mW is consumed in a first opamp, 9 mW in a second opamp, about 1 mW in SA analog components, and less than about 5 mW in all of the digital blocks. The circuit exhibits an INL of less than 1.0 14-bit LSB without calibration, and is applicable for a variety of sensing applications such as those involving mega-pixel CMOS-based bioluminescent detection for Pyrosequencing.

The various embodiments described above are provided by way of illustration only and should not be construed to limit the invention. Based upon the above discussion and illustrations, those skilled in the art will readily recognize that various modifications and changes may be made to the present invention without strictly following the exemplary embodiments and applications illustrated and described herein. For example, the circuits and chips shown herein may be implemented in connection with a variety of technologies such as those involving one or more of biosensors, image sensors, cameras, diagnostic circuits, imaging detectors, biochips, chemical sensors, optical sensors, gas sensors, analytical instruments, antibody screening circuits, and cellular assay arrangements. The circuits and chips may also be implemented with a variety of approaches such as those involving combinatorial biology, combinatorial chemistry, screening applications and genomics applications such as those for identifying DNA and genotypes. Such modifications and changes do not depart from the true spirit and scope of the present invention, including that set forth in the following claims.

What is claimed is:

1. A method for generating an error-corrected representation of a bioluminescence signal, the method comprising:
   oversampling and quantizing an analog representation of the bioluminescence signal to provide a first-stage digital output and a residual error;
   using successive approximation to provide the residual error as a second-stage digital output; and
   generating an error-corrected representation of the bioluminescence signal based upon the first-stage and second-stage digital outputs.

2. The method of claim 1, wherein the step of oversampling and quantizing includes using incremental ΣΔ modulation to provide the first-stage digital output and residual error.

3. The method of claim 1, wherein the step of oversampling and quantizing includes using an incremental ΣΔ modulation analog-to-digital conversion circuit to provide the first-stage digital output and residual error.

4. The method of claim 1, wherein
   the step of oversampling and quantizing includes providing an analog residual error, and
   the step of using successive approximation includes using an analog-to-digital converter circuit employing successive approximation to convert the analog residual error into a digital representation of the analog residual error, to provide the digital representation as the second stage digital output.

5. The method of claim 1, wherein the step of oversampling and quantizing includes using a feed-forward circuit to feed the residual error forward for
   providing the feed-forward error as the second-stage digital output, and
   generating the error-corrected representation of the bioluminescence signal using the second-stage digital output.

6. The method of claim 1, wherein
   the step of oversampling and quantizing includes sampling at a sampling frequency $f_s$ and at an oversampling ratio M to provide an estimate of the bioluminescence signal, and
   the step of using successive approximation to provide the residual error includes using successive approximation at a conversion rate of $f_s/M$ to provide the second-stage digital output at the end of the step of oversampling and quantizing for each sample.

7. The method of claim 1, wherein
   the step of oversampling and quantizing includes oversampling and quantizing an analog representation of a bioluminescence signal obtained from a mega-pixel sensor, and
   the step of generating an error-corrected representation of the bioluminescence signal includes generating an error-corrected representation of pixels detected by the mega-pixel sensor.

8. A circuit arrangement for generating an error-corrected representation of a bioluminescence signal, the arrangement comprising:
   a first-stage analog-to-digital converter (ADC) circuit for oversampling and quantizing an analog representation of the bioluminescence signal to provide a first-stage digital output and a residual error;
   a second-stage ADC circuit for using successive approximation to provide the residual error in a second-stage digital output; and
   an output circuit for generating an error-corrected representation of the bioluminescence signal based upon the first-stage and second-stage digital outputs.

9. The circuit arrangement of claim 8, wherein the first-stage ADC circuit uses incremental ΣΔ modulation to provide the first-stage digital output and residual error.

10. The circuit arrangement of claim 8, wherein
    the first-stage ADC circuit provides an analog residual error, and
    the second-stage ADC circuit employs successive approximation to convert the analog residual error into a digital representation of the analog residual error, to provide the digital representation as the second stage digital output.

11. The circuit arrangement of claim 8, wherein the first-stage ADC circuit uses a feed-forward circuit to feed the residual error forward for
    providing the feed-forward error as the second-stage digital output, and generating the error-corrected representation of the bioluminescence signal using the second-stage digital output.

12. The circuit arrangement of claim 8, wherein
the first-stage ADC circuit samples the bioluminescence signal at a sampling frequency $f_s$ and at an oversampling ratio M to provide an estimate of the bioluminescence signal, and
the second-stage ADC circuit uses successive approximation at a conversion rate of $f_s/M$ to provide the second-stage digital output for use with the first-stage digital output.

13. The circuit arrangement of claim 8, wherein
the first-stage ADC circuit oversamples and quantizes an analog representation of a bioluminescence signal obtained from a mega-pixel sensor, and
the output circuit generates an error-corrected representation of pixels detected by the mega-pixel sensor.

14. The circuit arrangement of claim 8, further including a mega-pixel sensor that is responsive to bioluminescence to provide the bioluminescence signal to the first-stage ADC circuit.

15. A semiconductor-based modulator circuit arrangement for sensing bioluminescence via oversampling, the circuit arrangement comprising:
a photosensor array for detecting light and providing an analog signal that characterizes the detected light;
a second order incremental ΣΔ modulator circuit exhibiting an analog residual error and adapted to process the analog signal to output a triangularly-weighted digital output signal;
a successive approximation analog-to-digital conversion (ADC) circuit adapted to encode the residual error of the modulator circuit and to provide a digital output corresponding to the encoded residual error; and
an output circuit to process the triangularly-weighted digital output signal with the encoded residual error output from the ADC circuit to provide an oversampled and corrected signal representing the detected light.

16. The arrangement of claim 15, wherein the photosensor array is responsive to bioluminescence for DNA-based Pyrosequencing and provides an analog signal that characterizes the bioluminescence.

17. A method for generating an error-corrected representation of an input sensor signal, the method comprising:
oversampling and quantizing an analog representation of the input signal to provide a first-stage digital output and a residual error;
using successive approximation to provide the residual error as a second-stage digital output; and
generating an error-corrected representation of the input signal based upon the first-stage and second-stage digital outputs.

18. The arrangement of claim 15, wherein
the second order incremental ΣΔ modulator circuit samples the analog signal at a sampling frequency $f_s$ and at an oversampling ratio M to provide an estimation of the analog signal, and
the ADC circuit uses successive approximation at a conversion rate of $f_s/M$ to provide the digital output corresponding to the encoded residual error.

19. The arrangement of claim 15, wherein the photosensor array is a mega-pixel sensor.

20. The method of claim 1, wherein the step of oversampling and quantizing includes using a second order incremental ΣΔ modulation analog to digital conversion circuit to provide the first stage digital output and residual error.

* * * * *